United States Patent
Van Heerden et al.

(10) Patent No.: US 7,121,402 B2
(45) Date of Patent: Oct. 17, 2006

(54) CONTAINER HERMETICALLY SEALED WITH CRUSHABLE MATERIAL AND REACTIVE MULTILAYER MATERIAL

(75) Inventors: David Peter Van Heerden, Baltimore, MD (US); Dale Deger, Littlestown, PA (US); Timothy P. Weihs, Baltimore, MD (US); Omar M. Knio, Timonium, MD (US)

(73) Assignee: Reactive Nano Technologies, Inc, Hunt Valley, MD (US)

( * ) Notice: Subject to any disclaimer, the term of this patent is extended or adjusted under 35 U.S.C. 154(b) by 0 days.

(21) Appl. No.: 10/814,243

(22) Filed: Apr. 1, 2004

(65) Prior Publication Data

US 2004/0200736 A1 Oct. 14, 2004

Related U.S. Application Data

(60) Provisional application No. 60/461,196, filed on Apr. 9, 2003.

(51) Int. Cl.
*B65D 25/08* (2006.01)
*B65B 51/10* (2006.01)

(52) U.S. Cl. .................... 206/222; 53/329.2

(58) Field of Classification Search ........ 206/219–222; 383/38; 53/329.2, 486, 487, 366
See application file for complete search history.

(56) References Cited

U.S. PATENT DOCUMENTS

| | | | |
|---|---|---|---|
| 3,158,927 A | 12/1964 | Saunders | |
| 4,301,325 A * | 11/1981 | Hutchison | ............... 174/76 |
| 4,607,779 A | 8/1986 | Burns et al. | |
| 4,715,526 A | 12/1987 | MacNeil et al. | |
| 4,898,293 A * | 2/1990 | Morel | ............... 215/250 |
| 5,038,996 A | 8/1991 | Wilcox et al. | |
| 5,137,171 A * | 8/1992 | Goeppner | ............... 220/667 |
| 5,175,410 A | 12/1992 | Freedman et al. | |
| 5,381,944 A | 1/1995 | Makowiecki et al. | |
| 5,477,009 A | 12/1995 | Brendecke et al. | |
| 5,538,795 A | 7/1996 | Barbee, Jr. et al. | |
| 5,547,715 A | 8/1996 | Barbee, Jr. et al. | |
| 5,656,112 A * | 8/1997 | Kuroda | ............... 156/69 |
| 5,956,576 A | 9/1999 | Pompeo et al. | |
| 6,413,800 B1 | 7/2002 | Kyle | |
| 6,534,194 B1 | 3/2003 | Weihs et al. | |
| 6,539,935 B1 * | 4/2003 | Ichikawa et al. | ...... 126/263.09 |
| 6,736,942 B1 | 5/2004 | Weihs et al. | |

(Continued)

FOREIGN PATENT DOCUMENTS

EP 0 907 064 A2 4/1999

(Continued)

OTHER PUBLICATIONS

U.S. Appl. No. 10/247,998, filed Jan. 21, 2004, Weihs et al.

(Continued)

*Primary Examiner*—Scott A. Smith
*Assistant Examiner*—John Paradiso
(74) *Attorney, Agent, or Firm*—Finnegan, Henderson, Farabow, Garrett, & Dunner, L.L.P.

(57) ABSTRACT

Embodiments of the invention include a method for sealing a container. The method includes, providing at least two components of the container, positioning a crushable material between the at least two components, positioning a reactive multilayer material between the at least two components, deforming the crushable material so as to form a seal between the at least two components, chemically transforming the reactive multilayer material so as to join the at least two components.

19 Claims, 8 Drawing Sheets

BEFORE JOINING

U.S. PATENT DOCUMENTS

| | | |
|---|---|---|
| 2001/0038029 A1 | 11/2001 | Weihs et al. |
| 2001/0046957 A1 | 11/2001 | Weihs et al. |
| 2002/0179921 A1 | 12/2002 | Cohn |
| 2002/0182436 A1 | 12/2002 | Weihs et al. |
| 2003/0077474 A1 | 4/2003 | Rabinkin et al. |
| 2003/0164289 A1 | 9/2003 | Weihs et al. |

FOREIGN PATENT DOCUMENTS

| | | |
|---|---|---|
| JP | S57-102029 A | 9/1982 |
| JP | 2000/323593 | 11/2000 |

OTHER PUBLICATIONS

U.S. Appl. No. 10/761,439, filed Jan. 21, 2004, Weihs et al.
U.S. Appl. No. 10/761,440, filed Jan. 21, 2004, Weihs et al.
U.S. Appl. No. 10/761,442, filed Jan. 21, 2004, Weihs et al.
U.S. Appl. No. 10/761,443, filed Jan. 21, 2004, Weihs et al.
U.S. Appl. No. 10/761,444, filed Jan. 21, 2004, Weihs et al.
U.S. Appl. No. 10/761,685, filed Jan. 21, 2004, Weihs et al.
U.S. Appl. No. 10/761,688, filed Jan. 21, 2004, Weihs et al.
R.J. Blobaum, et al., "Deposition and Characterization of a Self-Propagating CuOx/Al Thermite Reaction in a Multilayer Foil Geometry," Journal of Applied Physics, vol. 94(5), pp. 2915-2922, Sep. 1, 2003.
T.P. Weihs, "Self-Propagating Reactions in Multilayer Materials," published in the 1998 edition of the *Handbook of Thin Film Process Technology* edited by D.A. Glocker and S.I. Shah, 7 pages, (1998).
T.P. Weihs et al., "Self-Propagating Exothermic Reactions in Nanoscale Multilayer Materials," TMS Proceedings on Nanostructures, pp. 1-12, Feb. 1997.
E. Besnoin et al., "Effect of Reactant and Product Melting on Self-Propagating Reactions in Multilayer Foils," Journal of Applied Physics, vol. 92(9), pp. 5474-5480, Nov. 1, 2002.
T.S. Dyer and Z.A. Munir: "The Combustion Synthesis of Multilayer NiAl Systems"; Scripta Metallurgica et Materialia; 1994; pp. 1281-1286; vol. 30, No. 10.
D. Van Heerden, T.R. Rude, J. Newson, J. He, E. Besnoin, O.M. Knio, and T.P. Weihs; "A Tenfold Reduction in Interface Thermal Resistance for Heat Sink Mounting"; IMAPS Symposium; 2003.
D. Van Heerden, A.J. Gavens, S. Jayaraman, and T.P. Weihs; "Metastable Phase Formation and Microstructural Evolution During Self-Propagating Reactions in Al/Ni and Al/Monel Multilayers"; Material Research Society Symposium Proceedings; Fall 1997; pp. 533-538; vol. 481.
M.E. Reiss, C.M. Esber, D. Van Heerden, A.J. Gavens, M.E. Williams, T.P. Weihs; "Self-propagating Formation Reactions in Nb/Si Multilayers"; Materials Science and Engineering; 1999; pp. 217-222; vol. A261.
International Search Report and Written Opinion mailed Feb. 11, 2005 in a corresponding application.
"Technique for Obtaining an Environmentally Secure Adhesive Seal"; IBM Technical Disclosure Bulletin; Dec. 1, 1986; pp. 3085-3087; vol. 29, No. 7; XP002025799; ISSN: 0018-8689; IBM Corp.; New York, US.
S. Jayaraman, O.M. Knio, A.B. Mann, and T.P. Weihs; "Numerical Predictions of Oscillatory Combustion in Reactive Multilayers"; Journal of Applied Physics; Jul. 15, 1999; pp. 800-809; vol. 86, No. 2.
D. Josell, A. Cezairliyan, D. Van Heerden, and B.T. Murray; "Thermal Diffusion Through Multilayer Coatings: Theory and Experiment"; NanoStructured Materials; 1997; pp. 727-736; vol. 9 Nos. 1-8.
S. Jayaraman, A.B. Mann, O.M. Knio, D. Van Heerden, G. Bao, and T.P. Weihs; "Modeling Self-Propagating Exothermic Reactions In Multilayer Systems"; Materials Research Society Symposium Proceedings; 1998; pp. 563-568; vol. 481.
K.J. Blobaum, D. Van Heerden, A.J. Gavens, and T.P. Weihs; "Al/Ni Formation Reactions: Characterization of the Metastable $Al_9Ni_2$ Phase and Analysis of Its Formation"; Acta Materialia; 2003; pp. 3871-3884; vol. 51, No. 13.
A.J. Swiston Jr., T.C. Hufnagel, and T.P. Weihs; "Joining Bulk Metallic Glass Using Reactive Multilayer Foils"; Scripta Materialia; 2003; pp. 1575-1580; vol. 48.
U. Anselmi-Tamburini and Z.A. Munir; "The Propagation of a Solid-State Combustion Wave in Ni-Al Foils"; Journal of Applied Physics; Nov. 15, 1989; pp. 5039-5045; vol. 66, No.10.
A.J. Gavens, D. Van Heerden, A.B. Mann, M.E. Reiss, and T.P. Weihs; "Effect of Intermixing on Self-Propagating Exothermic Reactions in Al/Ni Nanolaminate Foils"; Journal of Applied Physics; Feb. 1, 2000; pp. 1255-1263; vol. 87, No. 3.

\* cited by examiner

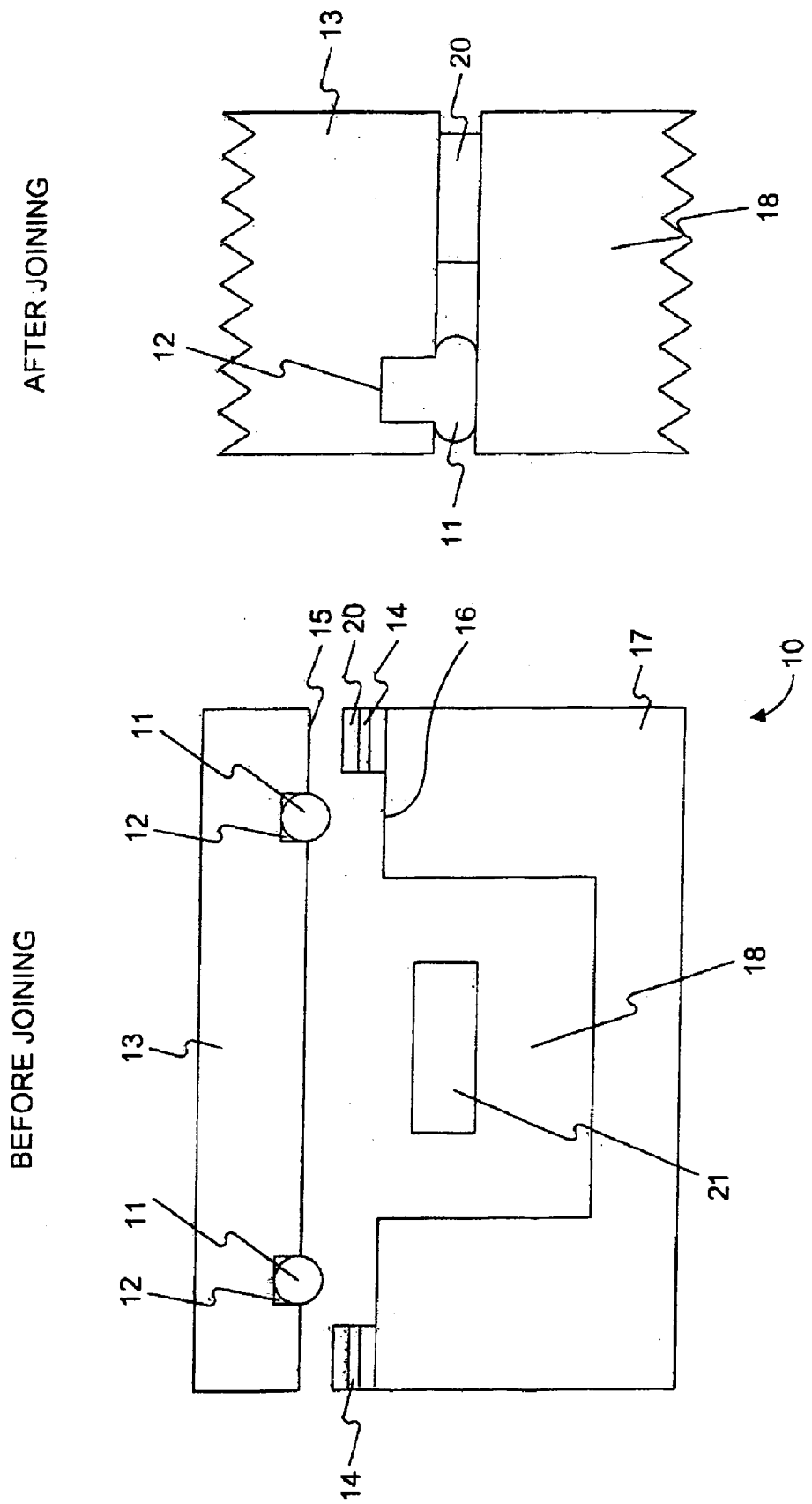

AFTER JOINING

BEFORE JOINING

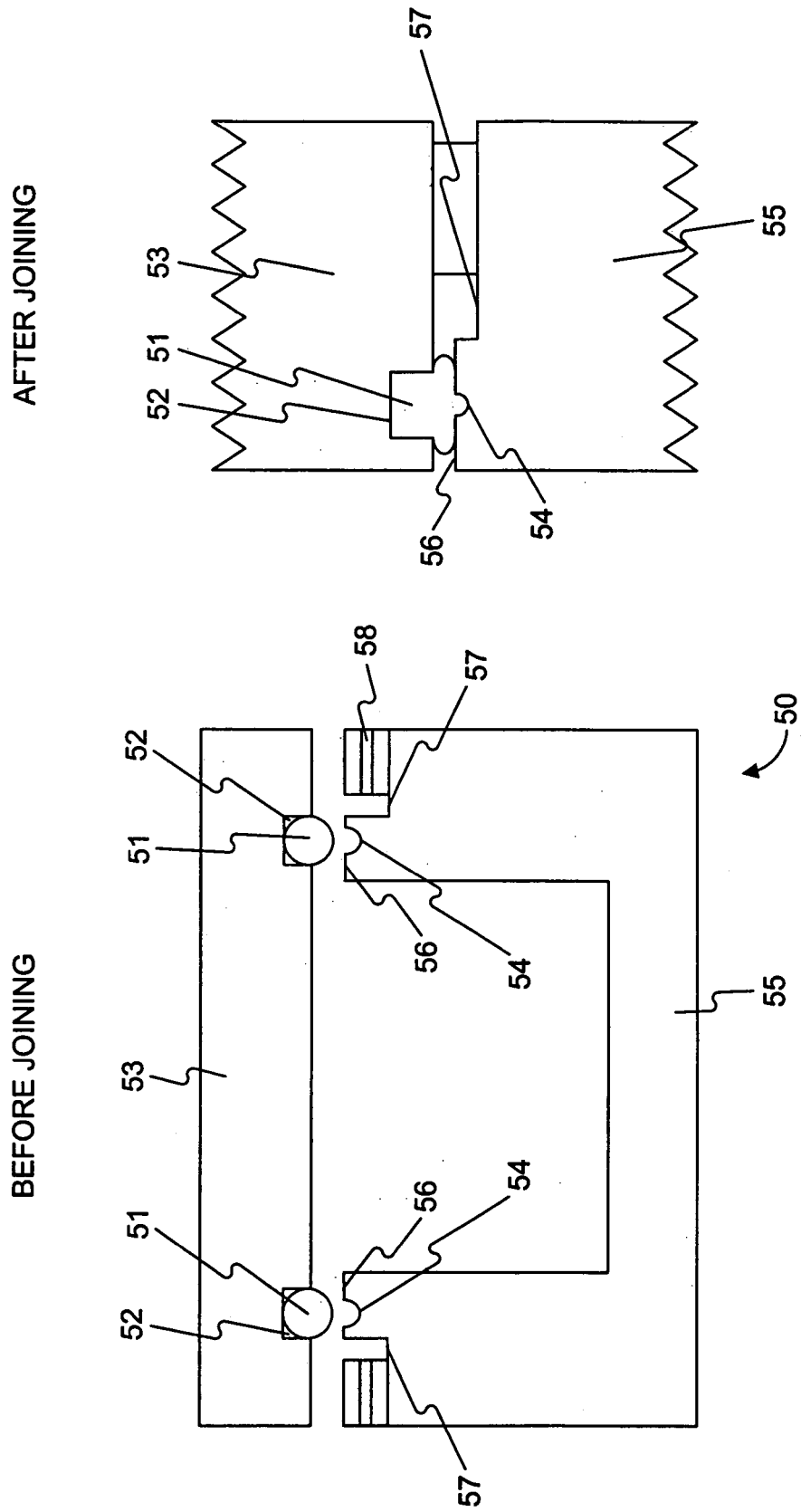

AFTER JOINING

BEFORE JOINING

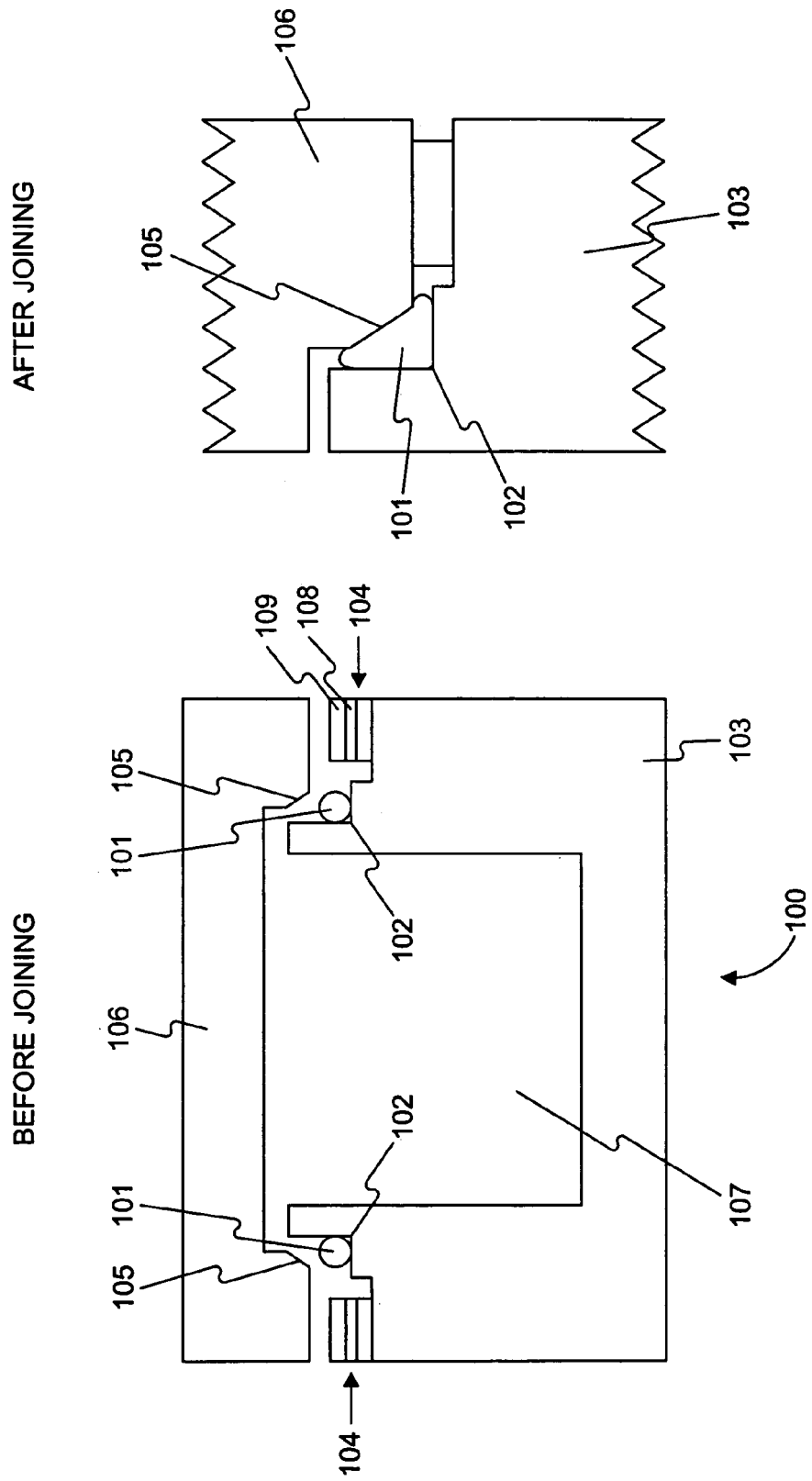

AFTER JOINING

BEFORE JOINING

AFTER JOINING

CONTAINER HERMETICALLY SEALED WITH CRUSHABLE MATERIAL AND REACTIVE MULTILAYER MATERIAL

CROSS-REFERENCE TO RELATED APPLICATION

This application claims the benefits of priority under 35 U.S.C. §§119(e) to U.S. Provisional Patent Application No. 60/461,196 to David P. VAN HEERDEN, Dale DEGER, Timothy P. WEIHS, and Omar M. KNIO, entitled METHOD OF HERMETIC SEALING AND RESULTING PRODUCTS, which was filed on Apr. 9, 2003, the entirety of which is incorporated herein by reference.

DESCRIPTION OF THE INVENTION

1. Field of the Invention

The invention includes hermetically sealing enclosure components by using a deformable material and a reactive multilayer joining material. The reactive multilayer joining material may include a reactive multilayer foil and a fusible material.

2. Background of the Invention

Hermetic sealing is used to protect many sensitive devices from the damaging effects of exposure to harmful environments. Examples of such sensitive devices include optical devices, photonic devices, fiber optics, MEMS and biomedical devices. Generally, sealing is achieved by encapsulating the sensitive component in a leak-tight enclosure, effectively isolating the component from the environment.

Several simple methods exist for sealing sensitive devices and components. Among them are the use of adhesives, epoxies, and mechanical fasteners. However, each of those methods have disadvantages that may prevent effective sealing. For example, adhesives and epoxies may degrade when exposed to heat and humidity. In another example, mechanical fasteners may require tight machining tolerances and may suffer from potentially low reliability (i.e., not provide a sufficiently leak-tight enclosure).

For high-end applications, the preferred methods of sealing include laser welding, e-beam welding, and thermal resistance welding. When carefully applied, these methods result in strong, substantially leak-tight, uniform bonds and are consequently quite effective at limiting the leak rates to very small values. These methods, however, also have drawbacks. For example, implementing these methods require tight tolerances and have high capital costs. Additional drawbacks include the need for surface treatment (e.g., polishing or machining the enclosure after implementing the sealing process), and the possibility that the sealing process may cause thermal damage to the enclosure materials being joined, which in extreme cases results in the loss of both the enclosure and the components disposed therein. Thus, there is need for an improved, more effective means for hermetically sealing sensitive components and devices.

One improved method for hermetically sealing sensitive components and devices is reactive multilayer joining. Reactive multilayer joining is a relatively new joining technique that is based on sandwiching a reactive multilayer foil between two layers of a fusible material and the two components to be joined, and then igniting the foil. The ignition of the foil initiates a self-propagating reaction which results in a rapid rise in the reactive foil temperature. The heat released by the reaction melts the fusible-material layers, and upon cooling, bonds the two components together.

Reactive multilayer joining has been known for quite a while. The process has been described in detail in U.S. Pat. No. 5,381,944, the entirety of which is incorporated herein by reference. Several improvements to the process in U.S. Pat. No. 5,381,944 are disclosed in U.S. Provisional Patent Application No. 60/201,292 filed on May 2, 2000 and entitled "Reactive Joining Using Multilayer Materials," the entirety of which is incorporated herein by reference. The reactive multilayers used in the reactive joining process are nanostructured materials that are typically fabricated by vapor depositing hundreds of nanoscale layers that alternate between elements with large, negative heats of mixing such as Ni and Al. Various implementations of these methods are disclosed in the following publications, the entirety of all of which are incorporated herein by reference: U.S. Pat. No. 5,538,795; U.S. Pat. No. 5,547,715; an article entitled "Deposition and Characterization of a Self-Propagating $CuO_x/Al$ Thermite Reaction in a Multilayer Foil Geometry" published in Journal of Applied Physics, Vol. 94(5) on Sep. 1, 2003; U.S. patent application Ser. No. 09/846,486 filed May 1, 2001 (U.S. Patent Application Publication No. 20020182436); and a chapter entitled "Self-Propagating Reactions in Multilayer Materials" published in the 1998 edition of the *Handbook of Thin Film Process Technology* edited by D. A. Glocker and S. I. Shah. Alternative methods for fabricating nanostructured reactive multilayers include mechanical processing, which is described in U.S. Pat. No. 6,534,194, the entirety of which is incorporated herein by reference, and electrochemical deposition.

Sealing enclosures with reactive multilayer joining, however, has failed to produce an enclosure with acceptably low leak rates necessary for high-end components. This failure can be traced to two well known effects: (i) densification of the reactive foil due to the reaction, and (ii) shrinkage of the foil upon cooling from the reaction temperature to room temperature. Both of these effects cause the formation of cracks along the foil which are subsequently filled by molten solder or braze. As a result, the reactive joint structure consists of a brittle material (the reacted foil) which is encapsulated by ductile solder or braze matrix. While this result, which can be confirmed by optical microscopy, is essential for the formation of mechanically strong bonds, because some of the cracks that form during the reaction are not completely filled with the fusible material, the seal may fail or target leak-rates may not be achieved. Consequently, reactive joining does not currently offer an adequate means for consistently forming high-end hermetic seals.

SUMMARY OF THE INVENTION

Embodiments of the invention include a method for sealing a container. The method includes, providing at least two components of the container, positioning a crushable material between the at least two components, positioning a reactive multilayer material between the at least two components, deforming the crushable material so as to form a seal between the at least two components, chemically transforming the reactive multilayer material so as to join the at least two components.

In various embodiments, the invention may include one or more of the following aspects: positioning a fusible material between the at least two components; chemically transforming the reactive multilayer material may include transforming the fusible material so as to join the at least two components; the reactive multilayer material may include a reactive multilayer foil; the reactive multilayer material may include a fusible material; the seal may be a hermetic seal;

chemically transforming the reactive multilayer material may form another seal between the at least two components; the another seal may be a hermetic seal; deforming the crushable material may include applying force to at least one of the at least two components; determining the quality of the seal; determining the quality of the seal may include determining a leak rate of the seal; providing predetermined quality parameters for the seal; determining the quality of the seal may include determining whether the quality of the seal is within the predetermined quality parameters; chemically transforming the reactive multilayer material may include igniting at least a portion of the reactive multilayer material; deforming the crushable material may seal an interior of the container from an outside environment; selecting the reactive multilayer material based on the strength of the seal desired; the crushable material may be configured to permanently deform; the crushable material may be configured to reversibly deform the crushable material may include a soft metal; the crushable material may include at least one of copper, gold, aluminum, stainless steel, Kovar, and soft solder; the crushable material may include a compressible polymer; the crushable material may include at least one of buna rubber, silicon rubber, and viton; the crushable material may positioned on an inward side of the reactive multilayer material relative to the outside environment; providing a groove on one of the at least two components; positioning the crushable material may include placing the crushable material in the groove; providing a protrusion on one of the at least two components; deforming the crushable material may include deforming the crushable material against the protrusion; providing another protrusion on another of the at least two components; deforming the crushable material may include deforming the crushable material against the another protrusion; providing a groove on one of the at least two components; deforming the crushable material may include deforming the crushable material into the groove; providing a corner on one of the at least two components; positioning the crushable material may include placing the deformable material in the corner; providing a corner on one of the at least two components; deforming the crushable material may include deforming the crushable material into the corner; one of the at least two components may be a lid and the other of the at least two components may be a container body.

Another embodiment of the invention includes a sealed product. The sealed product includes at least two components defining a container, a crushable material disposed between the at least two components, the crushable material being in a deformed state and forming a seal between the at least two components, and a remnant of a chemical transformation of a reactive multilayer material disposed between the at least two components and joining said at least two components.

In various embodiments, the invention may include one or more of the following aspects: the reactive multilayer material may include a reactive multilayer foil; the reactive multilayer material may include a fusible material; the fusible material may be configured to join the at least two components; a fusible material may be disposed between the at least two components; the crushable material may be located on an inward side of the remnants of the chemical transformation of the reactive multilayer material; the crushable material and the remnant of the chemical transformation may cooperate to form a hermetic seal between the at least two components; the crushable material may be configured to permanently deform; the crushable material may be configured to reversibly deform; the crushable material may include a soft metal; the crushable material may include at least one of copper, gold, aluminum, stainless steel, Kovar, and soft solder; the crushable material may include a compressible polymer; the crushable material may include at least one of buna rubber, silicon rubber, and viton; the crushable material may be at least partially disposed in a groove of one of the at least two components; the crushable material may be at least partially disposed in another groove of another of the at least two components; the crushable material may be disposed against a protrusion on one of the at least two components; the crushable material may be disposed against another protrusion on another of the at least two components; the crushable material may be disposed in a corner of one of the at least two components; one of the at least two components may be a lid and another of the at least two components may be a container body.

A further embodiment of the invention includes a kit for forming a sealed container. The kit includes at least two components which, when joined, define the container, a crushable material configured to be positioned between the at least two components, and a reactive multilayer material configured to be positioned between the at least two components. The crushable material, in a deformed state, is configured to substantially form a seal between the at least two components. At least a portion of the reactive multilayer material is configured to be chemically transformed so as to join the at least two components.

In various embodiments, the invention may include one or more of the following aspects: the reactive multilayer material may include a reactive multilayer foil; the reactive multilayer material may include a fusible material; the fusible material may be configured to join the at least two components; a fusible material configured to be disposed between the at least two components; the crushable material may be configured to be positioned on an inward side of the reactive multilayer material relative to the outside environment; the crushable material and a remnant of the chemical transformation of the reactive multilayer material may cooperate to form a hermetic seal between the at least two components; the crushable material may be configured to permanently deform; the crushable material may be configured to reversibly deform; the crushable material may include a soft metal; the crushable material may include at least one of copper, gold, aluminum, stainless steel, Kovar, and soft solder; the crushable material may include a compressible polymer; the crushable material may include at least one of buna rubber, silicon rubber, and viton; one of the at least two components may include a groove configured to at least partially receive the crushable material; another of the at least two components may include another groove configured to at least partially receive the crushable material; one of the at least two components may include a protrusion configured to be disposed against the crushable material; another of the at least two components may include another protrusion configured to be disposed against the crushable material; one of the at least two components includes a corner may be configured to receive the crushable material; one of the at least two components may be a lid and another of the at least two components may be a container body.

Yet another embodiment of the invention includes a seal testing apparatus. The seal testing apparatus includes a chamber, an instrument configured to apply pressure to a container disposed in the chamber, a port configured to provide and remove gas from the chamber, a trigger configured to initiate a chemical transformation of a reactive multilayer material, and a leak detector configured to detect a leak from the container.

In various embodiments, the invention may include one or more of the following aspects: the reactive multilayer material may be a reactive multilayer foil; the instrument may be a push rod; the chamber may be a vacuum chamber; the port may be configured to create a vacuum in the chamber; the port may be connected to a source of gas; the port may be connected to a vacuum source.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) of the invention and together with the description, serve to explain the principles of the invention.

BRIEF DESCRIPTION OF THE DRAWINGS

FIGS. 1A–1B are various schematic views of components of a sealed product and a portion of a sealed product, according to another embodiment of the invention;

FIGS. 3A–3B are various schematic views of components of a sealed product and a portion of a sealed product, according to a further embodiment of the invention;

FIGS. 5A–5B are various schematic views of components of a sealed product and a portion of a sealed product, according to a still further embodiment of the invention;

DESCRIPTION OF THE EMBODIMENTS

Figure 2B:
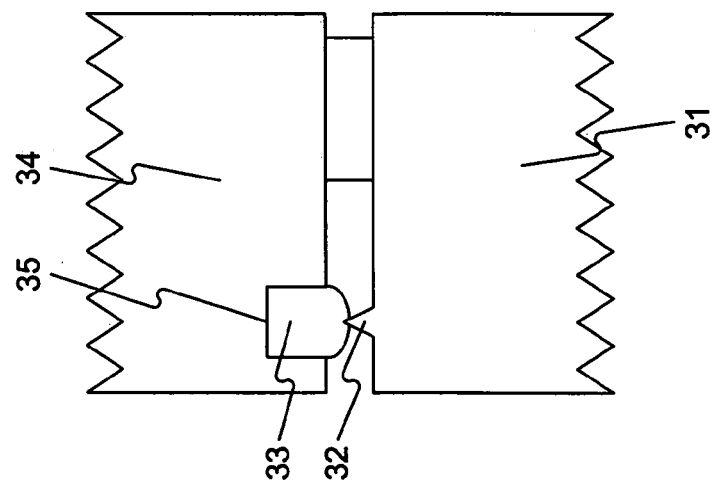
FIGS. 2A–2B are various schematic views of components of a sealed product and a portion of a sealed product, according to another embodiment of the invention.

Reference will now be made in detail to the exemplary embodiments of the invention, examples of which are illustrated in the accompanying drawings. Wherever possible, the same reference numbers will be used throughout the drawings to refer to the same or like parts.

FIGS. 1–8 depict various exemplary embodiments of a hermetically sealed product and related methods of manufacture. The hermetically sealed product may include a judicious combination of a mechanical seal and a reactive multilayer joint. Specifically, the hermetic sealed product may include a combination of (1) a "crushable" or "soft" material which, when adequately deformed under pressure, results in a high-quality seal between the device and the environment, and (2) a reactive multilayer joint which maintains the mechanical integrity of the seal after the force (e.g., pressure) applied to deform the "crushable" or "soft" material is removed.

An exemplary embodiment of a method for manufacturing the hermetically sealed product may include: (a) positioning one or more crushable materials between two or more components that define an enclosed space, (b) positioning one or more reactive multilayer foils between the two or more components (e.g., a lid and a container), (c) applying pressure on the assembly (e.g., at least one of the two or more components) so as to deform the crushable material and thus seal the enclosed space from the outside environment, and (d) igniting the one or more reactive multilayer foils to form the reactive multilayer joint.

The crushable material may be in the form of a wire, gasket, washer, and/or any other suitable material that can be deformed under pressure. The deformation, which may be either permanent or reversible, may be such that a seal is formed between the two or more components and/or across the crushable material when pressure is applied to the crushable material. The cross-section of the wire, gasket, washer and/or any other suitable material may range from 1 millimeter to one centimeter in diameter and/or the lengths of these materials may range from several millimeters to more than one meter. One of ordinary skill in the art understands, however, that the crushable material may have any suitable shape, cross-sectional or otherwise, and/or may have any suitable dimensions.

Some crushable materials may deform permanently (i.e., plastically) while still retaining sufficient mechanical strength to maintain a seal, including when a pressure differential exists between the enclosed space and the outside environment. Examples of crushable materials that may deform permanently include soft metals such as copper, gold, and/or aluminum. Other examples of crushable materials that may deform permanently may include a hard core (e.g., stainless steel) and a soft outer shell (e.g., copper and/or aluminum).

Other crushable materials may reversibly deform during pressurization (i.e., once the pressure is removed, the crushable material substantially returns to its original configuration). Such reversibly crushable materials may include polymeric materials (e.g., buna rubber, silicon rubber, and/or viton). Reversibly crushable materials have the advantage that they may be reused after being deformed.

Still other crushable materials may include an outer shell of readily deformable materials (e.g., copper and/or aluminum) around a spring-like material (e.g., stainless steel). Some of the crushable materials set forth herein may be reusable while others may be configured for single use only.

Methods of manufacturing a hermetically sealed product may include one or more reactive multilayer joining methods, examples of which are disclosed in U.S. Pat. No. 5,381,944, U.S. patent application Ser. No. 09/846,486 filed May 1, 2001 (U.S. Patent Application Publication No. 20020182436), and U.S. Provisional Patent Application No. 60/201,292 filed on May 2, 2000, the entirety of all of which are incorporated herein by reference.

Methods of manufacturing a hermetically sealed product also may include one or more methods for obtaining sufficient joint strength between two or more components. The strength requirement applicable to the seal may be augmented by the requirement that the joint maintains the deformation of the crushable material after the pressure on the enclosure components, which were previously maintaining the deformation of the crushable material, is released. For example, the joint should be strong enough to withstand normal jostling of the hermetically sealed product, or other external forces, while at the same time maintaining the deformation of the crushable material (and hence the seal) after the pressure has been removed from the enclosure components.

The fusible material (e.g., solder or braze) for the reactive joining process may be selected based on one or more relevant factors. Some of those factors may include the strength requirement (e.g., due to the type of crushable material used), thermal fatigue resistance, corrosion resistance, low splatter, and/or vapor emission. The use of brazes as the fusible material may be preferable if the sealed device is normally subject to high temperatures during use.

FIGS. 1A and 1B depict an exemplary embodiment of a hermetic sealed product 10 and related method of manufacture. As depicted in FIGS. 1A and 1B, a wire gasket 11 or other suitable crushable (i.e., deformable) material 11 may be positioned in or on a portion of one of the enclosure components, for example, a groove 12 of a lid 13. The groove 12 may be formed in the enclosure component (e.g., lid 13) using any suitable method. A reactive multilayer foil 14 may be positioned on and/or between one or more surfaces 15, 16 of two or more enclosure components, for example, a lid 13 and a container 17. The enclosure components 13, 17 may define an enclosure space 18 within which a device 21 may be placed. The reactive multilayer foil 14 may also be positioned on and/or between one or more layers of fusible material 20. The crushable material 11 may then be deformed between the groove 12 of one enclosure component 13 and the surface 16 of another enclosure component 17, for example, by applying pressure to any appropriate portion (e.g., the top of the lid 13) of one of the enclosure components using any suitable method. Such deformation of the crushable material 11 may seal the enclosed space 18 and/or the device 21 from the external environment. The reactive multilayer foil 14 may then be ignited and form a strong mechanical bond between the enclosure components, for example, the lid 13 and the container 17. The strong mechanical bond may be formed by either the bonding of fusible materials 20 to the enclosure components 13, 17, or directly bonding the enclosure components 13, 17. Any pressure on the one or more of the enclosure components may then be removed, and the result is a sealed enclosure 10 configured to maintain a sufficiently leak-tight seal with sufficient integrity for a relatively long period of time.

In various embodiments, the reactive multilayer foils, joining materials, and/or other suitable "fusible" material may be positioned on any side and/or any portion of the reactive multilayer. The fusible material layers may be in any suitable form, for example, a free-standing sheet, a layer that is pre-deposited onto the enclosure component (e.g., the container and/or the lid), and/or a layer that is pre-deposited onto the foil surface. These and other suitable forms are disclosed in U.S. Pat. No. 5,381,944, U.S. patent application Ser. No. 09/846,486 filed May 1, 2001 (U.S. Patent Application Publication No. 20020182436), and U.S. Provisional Patent Application No. 60/201,292 filed on May 2, 2000. Examples of fusible material include solder and/or braze. The solder and/or braze may be deposited onto the enclosure components, may be a free-standing sheet that is positioned between the foil and/or enclosure components, and/or may be deposited onto the foil surface.

Figure 2A:
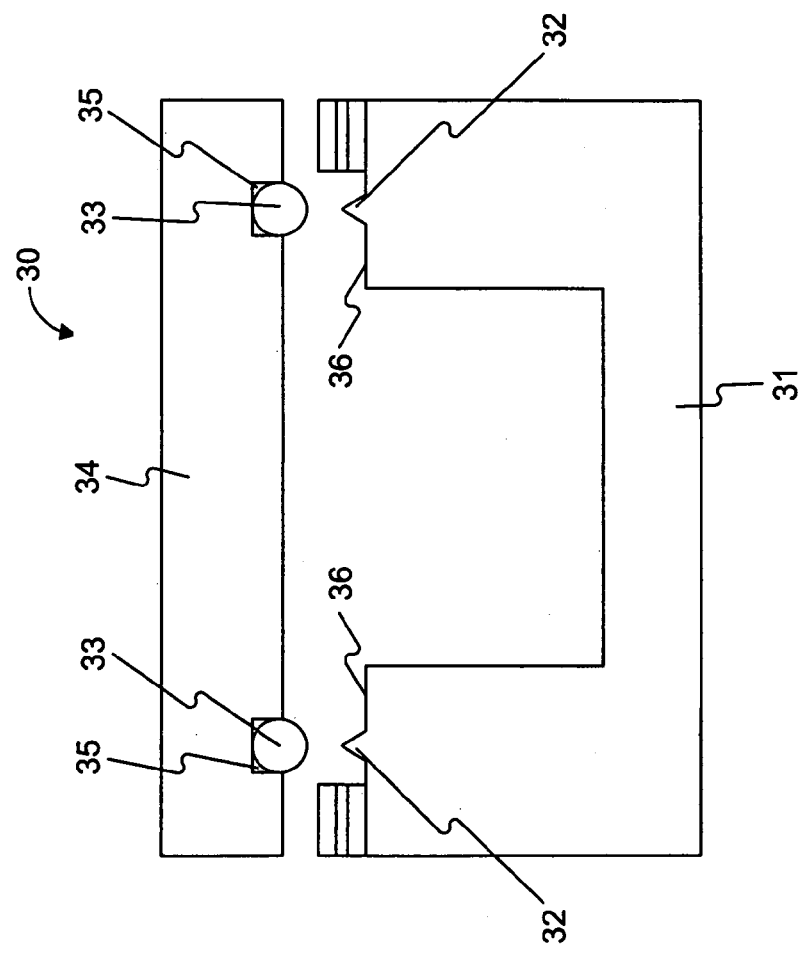

FIGS. 2A and 2B depict another exemplary embodiment of a hermetic sealed product 30 and related method of manufacture. This embodiment is substantially similar to the embodiment set forth in FIGS. 1A and 1B, except that the surface of one of the enclosure components (e.g., the container 31) may include a protrusion 32 (e.g., ridge) configured to interact with the crushable material 33 disposed in or on another enclosure component 34. For example, the protrusion 32 may be disposed substantially opposite the groove 35 on the other enclosure component, (e.g., the top lid 34). The protrusion 32 may have any suitable shape and/or dimension, such as a ridge-shape as depicted in FIGS. 2A and 2B, and may be formed on the surface 36 of the enclosure component 31 using any suitable method. This arrangement may be advantageous in that due to the interaction between the protrusion 32 and the crushable material 33 disposed in or on the enclosure component, less pressure may be required to deform the crushable material (e.g., wire gasket 33) than in the arrangement of FIG. 1.

FIGS. 3A and 3B depict a further exemplary embodiment of a hermetic sealed product 50 and related method of manufacture. This embodiment is substantially similar to the embodiments set forth in FIGS. 1A–1B and 2A–2B, except the crushable material (e.g., wire gasket 51) is disposed in both a groove 52 of one of the enclosure components (e.g., in the top lid 53) and prior to deformation is disposed substantially opposite to an opposing groove 54 (e.g., trough) on another of the enclosure components (e.g., the container 55). The trough 54 or groove 54 may be disposed on a surface 56 of the enclosure component 55 that is raised relative to another surface 57, for example, the surface 56 on which the reactive foil 58 may be disposed. During deformation, the crushable material 51 is deformed between the groove 52 and the trough 54. The advantage of this arrangement is that the trough 54 or groove 54 may be easier to machine than the protrusion 32 in FIGS. 2A–2B, and may be less vulnerable to damage during handling than either the smooth surface 16 in FIGS. 1A–1B or the protrusion 32 in FIG. 2A–2B. Deforming the crushable material 51 to form the seal requires a pressure similar to the pressure applied to the arrangement in FIGS. 2A–2B (i.e., lower than the pressure applied in arrangement of FIGS. 1A–1B).

Figure 4B:
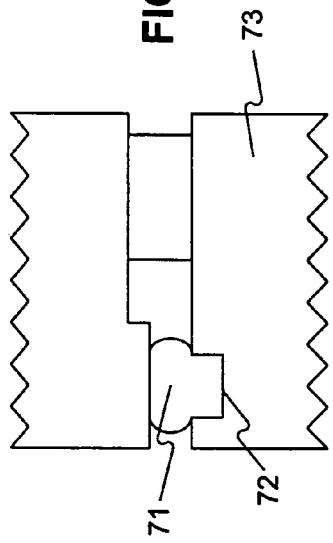
FIGS. 4A–4B are various schematic views of components of a sealed product and a portion of a sealed product, according to yet another embodiment of the invention.
Figure 4C:
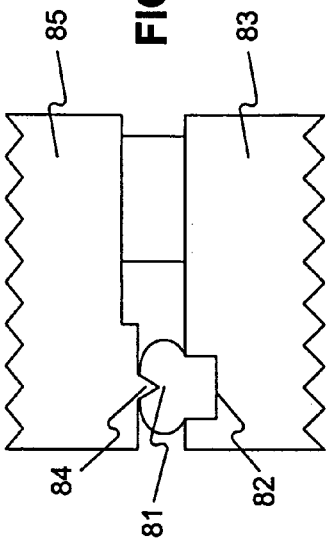
FIG. 4C is a schematic view of a portion of a sealed product, according to a yet further embodiment of the invention.
Figure 4D:
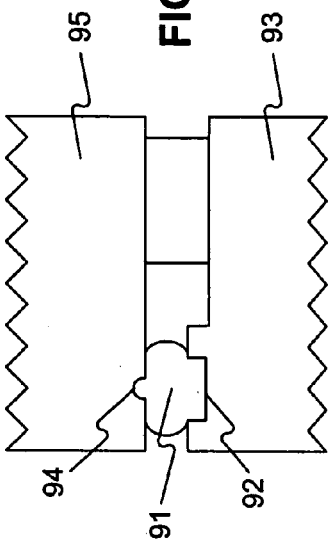
FIG. 4D is a schematic view of a portion of a sealed product, according to still another embodiment of the invention.
Figure 4A:
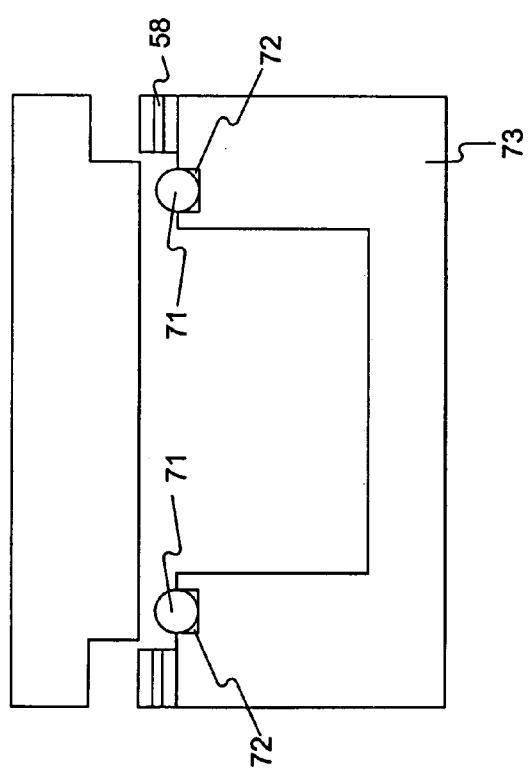

One of ordinary skill in the art recognizes that any of the features in any of the embodiment set forth herein may be reversed, interchanged, and/or combined with any other feature set forth herein. For example, FIGS. 4A and 4B depict an configuration similar to the configuration in FIGS. 1A and 1B except that the crushable material 71 is disposed in a groove 72 on the container 73 and the corresponding surface of the lid is configured to interact with the reactive multilayer. In another example, FIG. 4C depicts a configuration similar to the configuration in FIGS. 2A and 2B except that the crushable material 81 is disposed in a groove 82 on the container 83 and the protrusion 84 is disposed on the lid 85. In a further example, FIG. 4D depicts a configuration similar to the configuration in FIGS. 3A and 3B except that the crushable material 91 is disposed in a groove 92 on the container 93 and the opposing trough 94 or groove 94 is on the lid 95.

FIGS. 5A and 5B depict yet another exemplary embodiment of a hermetic sealed product 100 and related method of manufacture. In this embodiment, a crushable material (e.g., wire gasket 101) is disposed in a corner 102 machined (or otherwise manufactured) in one of the enclosure components (e.g., the container 103). Thus, unlike the other embodiments set forth herein, additional machining (or other manufacturing) steps may be need to be performed on one or more of the enclosure components so as to provide satisfactory fits for the crushable material 101 and/or the reactive multilayer 104. As pressure is applied to one or more of the enclosure components, the crushable material 101 may be deformed in the corner 102 by a portion of the other enclosure component (e.g., a surface 105 on a lid 106) and may consequently seal the enclosed interior space 107 defined by the enclosure components (e.g., the lid 106 and the container 103). The reactive multilayer foil 108 of the reactive multilayer 104 may then be triggered and/or ignited so as to bond the substantially adjacent portions of the enclosure components (e.g., the outer lips of the lid 106 and container 103) and/or bond the fusible materials 109 to the enclosure components 103, 106. Long-term integrity of the seal is consequently achieved. The implementation of this sealing configuration and/or method may be advantageous because it may require less sealing pressure (e.g., to deform the crushable material) than the configurations and/or methods set forth in FIGS. 1A–4D. Another advantage this configuration and/or method shares with the configurations and/or methods set forth in FIGS. 1A–4D is that, in case the deformation of the crushable material does not form an adequate seal, the crushable material may be discarded prior to triggering (e.g., igniting) the reactive multilayer foil and the sealing procedure may be repeated with another crushable material.

Figure 6B:
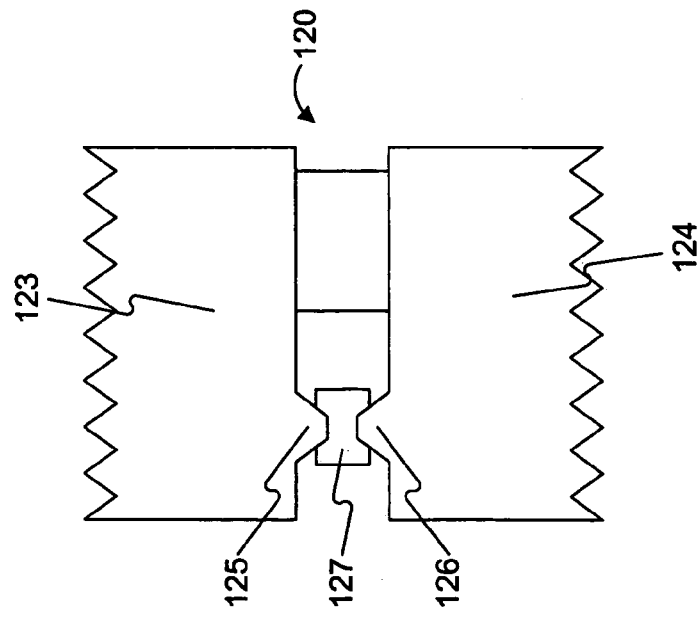
FIGS. 6A–6B are various schematic views of components of a sealed product and a portion of a sealed product, according to another embodiment of the invention.
Figure 6A:
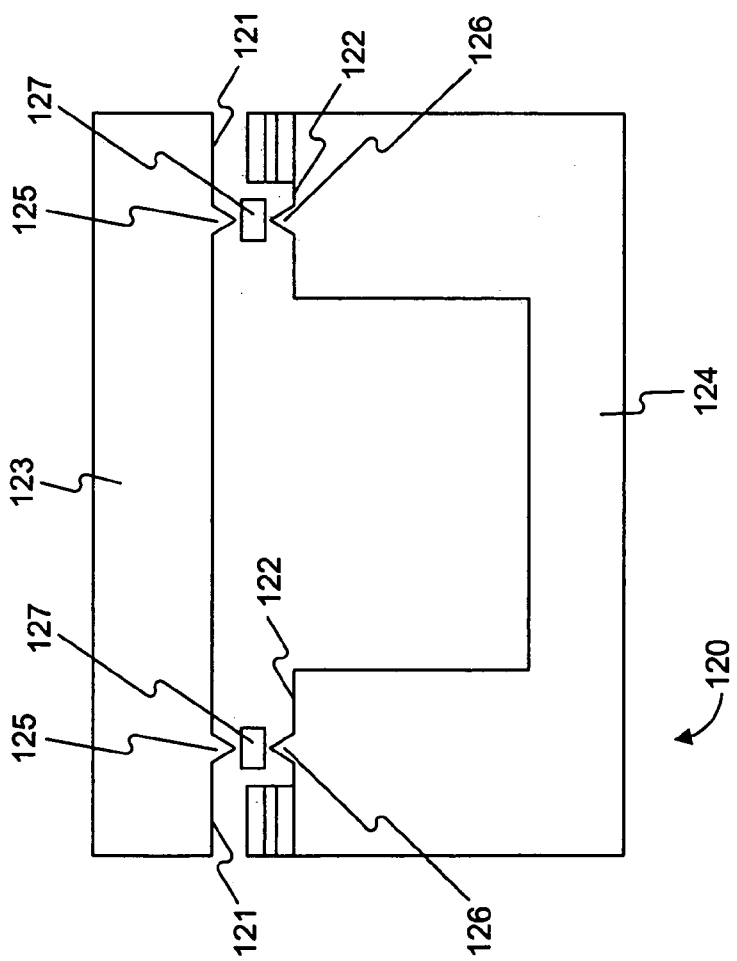

FIGS. 6A and 6B depict a yet further exemplary embodiment of a hermetic sealed product 120 and related method of manufacture. In this embodiment, the opposing surfaces 121, 122 of the two or more enclosure components 123, 124 include protrusions 125, 126 (e.g., sharp-edge ridges) configured to interact with a crushable material 127. To maintain their sharpness, the ridges 125, 126 may need to be protected prior to placement of the crushable material 127. When the two or more enclosure components 123, 124 are aligned prior to sealing, their respective ridges 125, 126 may substantially oppose each other. The ridges 125, 126 may be a hard material, at least relative to the gasket, washer, or other suitable crushable material 127. The gaskets, washers, and/or any other suitable softer (e.g., relative to the ridges 125, 126 and/or enclosure components 123, 124) and/or crushable material 127 may be placed between corresponding ridges 123, 124. The gaskets 127 and/or washers 127 may need to be properly and/or positioned on the ridges 125, 126 in order to form an effective seal upon deformation. Sealing may be accomplished by exerting sufficient pressure on one or more of the enclosure components 123, 124 so that the harder sharp-edge ridges 125, 126 suitably deform the softer crushable material 127. Potential advantages of this approach include (1) it may be easier to handle simple gaskets and/or washers than other materials, (2) there may be lower requirements for surface flatness and finish (e.g, of the enclosure components), and/or (3) less pressure may needed to deform the crushable material and form a suitable seal, for example, relative to the other embodiments set forth herein.

Figure 7A:
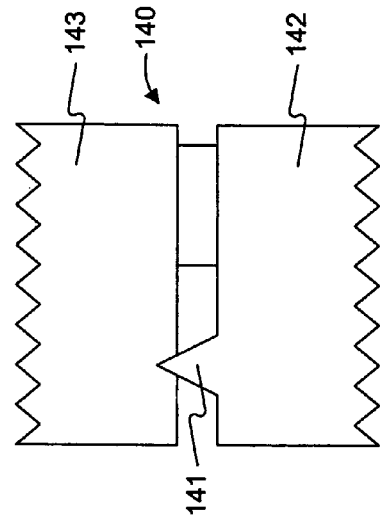
FIGS. 7A–7B are various schematic views of components of a sealed product and a portion of a sealed product, according to a further embodiment of the invention.
Figure 7B:
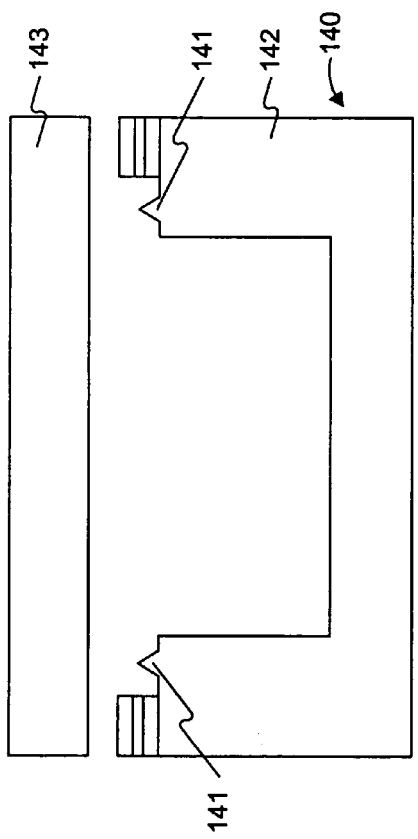
Figure 7C:
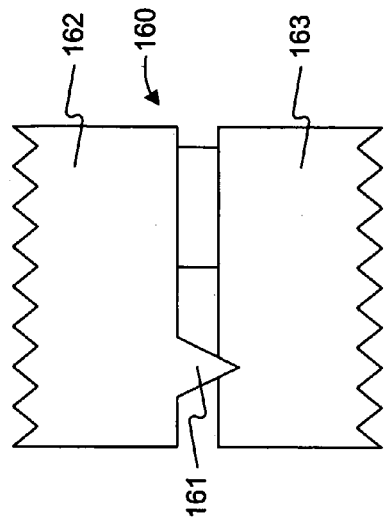
FIGS. 7C–7D are various schematic views of components of a sealed product and a portion of a sealed product, according to yet another embodiment of the invention.
Figure 7D:
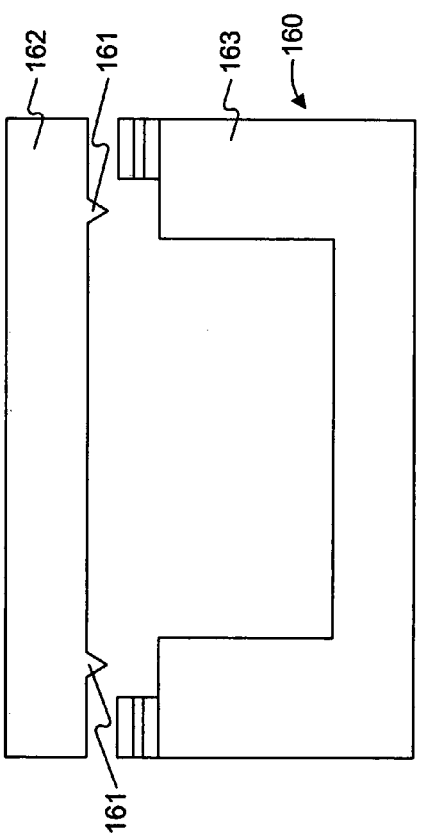

FIGS. 7A–7D depict still more exemplary embodiments of a hermetic sealed product 140, 160 and related method of manufacture. In these embodiments the use of a soft washer, gasket, or other discrete crushable material may be eliminated, and instead a sharp-edge ridge 141, 161 or protrusion 141, 161 on one of the enclosure components 142, 162 may used to press directly against and into the softer surface of the other enclosure component 143, 163. The soft or hard materials may preferably be selected so as to avoid a galvanic couple. FIGS. 7A and 7B depict an embodiment where the sharp-edge ridge 141 of the container 142 presses direct against and/or into softer material of the lid 143. FIGS. 7C and 7D depict an embodiment where the sharp-edge ridge 161 of the lid 162 presses direct against and/or into softer material of the container 163. One of ordinary skill in the art understands that only a portion of each of the enclosure components may be made of the harder and/or softer material, for example, as may be necessary to effect the seal between the enclosure components. Some advantages of these designs include lower machining effort (i.e., easier to manufacture), and the elimination of wires, gaskets, washers, and/or other discrete crushable materials. One additional advantage of this embodiment, and especially to the arrangement of FIGS. 7A and 7B, is that the enclosure component without the special geometric features (e.g., the lid 143 in FIGS. 7A and 7B, or the container 163 in FIGS. 7C and 7D) may be discarded and/or replaced if the seal is found to be inadequate. The other component may also be reused. Another advantage is that because the enclosure component made of the softer and/or crushable material (e.g., the lid 143 in FIGS. 7A and 7B, or the container 163 in FIGS. 7C and 7D) does not include special geometric features, that enclosure component may be relatively inexpensive to manufacture and/or replace relative to the other enclosure components set forth herein.

One advantage of the invention, exemplary embodiments of which are set forth herein, is that the sensitive components positioned within the enclosed space of the container are protected by the sealing surface and/or crushable material from the flow of the fusible material (e.g., solder or braze) that is used in the reactive joining process. Specifically, in previous methods where no sealing surface and/or crushable material was used, the fusible material, while in its molten state, sometimes may leak into the enclosed space of the container, and consequently damage the sensitive component housed therein. In the embodiments disclosed herein, however, because the sealing surface and/or crushable material is positioned inward of the fusible material, that is, between the fusible material and the enclosed space, the possibility that the fusible material could flow into the enclosed space and damage the sensitive component housed therein is substantially reduced, if not effectively eliminated. The molten fusible material (e.g., solder or braze) would be trapped by the sealing surface and/or crushable material (e.g., wire, gasket, washer and its support, or by sharp-edge ridge). This is an advantage over conventional reactive joining methods.

Another advantage of the invention, exemplary embodiments of which are set forth herein, is that the quality of the seal (e.g., due to the sealing surface and/or crushable material) can be assessed and ensured before the seal is made permanent (e.g., through reactive joining). This is the case because prior to foil ignition and reactive bonding, the seal may be obtained by applying pressure to one or more of the enclosure components and deforming the sealing surface and/or crushable material. Should the quality of the seal from this application of pressure be deemed unsatisfactory, one or more portions of the enclosure assembly may be adjusted without risking the loss of the sensitive component located within the container. Such adjustments may include replacing of the wire, gasket, washer, and/or other suitable material, polishing the surfaces of one or more enclosure components (e.g., the lid and/or container), or re-tooling the faulty portions of the enclosure assembly. This ability to assess the quality of the seal prior to permanently sealing the enclosure is a substantial advantage over most alternative approaches where sealing is achieved through permanent or irrecoverable alterations to the assemblies. Examples of such alternatives include laser welding, soldering or brazing, as well as the use of screws or mechanical fasteners.

Figure 8:
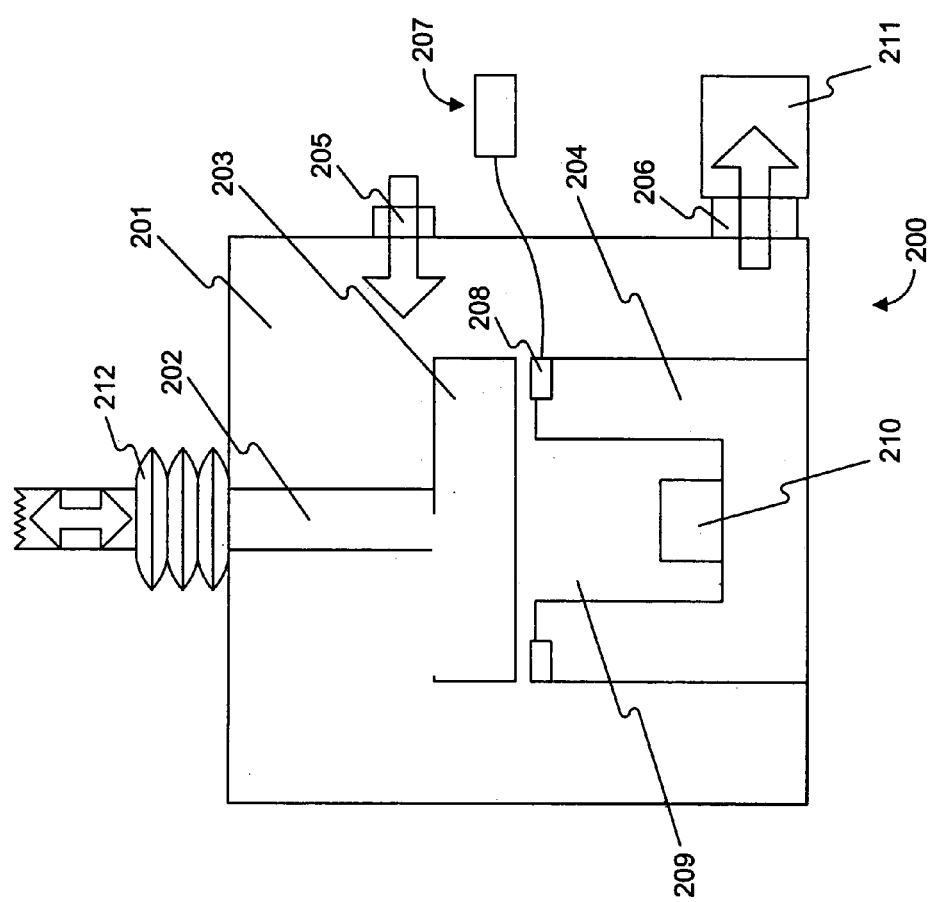
FIG. 8 is a schematic view of a seal testing apparatus, according a yet further embodiment of the invention.

In various embodiments of the invention, verification of the quality of the seal prior to the formation of the permanent bond can be achieved using a seal testing apparatus. An example of such a seal testing apparatus 200 is shown in FIG. 8. As depicted in FIG. 8, the apparatus 200 may include one or more vacuum chambers 201, a push-rod 202 or similar mechanism for positioning one of the enclosure components (e.g., the lid 203) relative to the other enclosure component (e.g., on top of the container 204) and/or applying pressure on one or more portions of the enclosure, one or more inlets 205 for filling the chamber 201 with a gas (for example, an inert gas such He or Ar) or a gas mixture (for example, an inert gas mixture containing He), one or more outlets 206 for evacuating from the chamber 201 a gas (for example, an inert gas such He or Ar) or a gas mixture (for example, an inert gas mixture containing He), and means 207 for igniting the reactive multilayer 208 (e.g., a reactive multilayer foil that may or may not have fusible and/or joining materials). The push rod 202 may include a bellow 212, for example, assist in moving the push rod 202 and/or seal the interface between the push rod 202 and the wall of the chamber 201 through which the push rod 202 extends. The inlet and outlet may also be the same port (i.e., gas or a gas mixture may be filled to and/or evacuated from the chamber by the same inlet, outlet, and/or port). Examples of means 207 for igniting the reactive multilayer 208 include an internal device which may provide an electrical, thermal or mechanical stimulus, and/or an external device such as laser. In the case where the means for igniting the reactive multilayer is a laser, an optical path may be provided through the walls of the vacuum chamber 201.

In various embodiments, the process for manufacturing a hermetically sealed product may include one or more of the following steps: (1) position the two or more enclosure components (e.g., container and lid) in the chamber 201, (2) evacuate the chamber 201 using suitable means known in the art, for example, a vacuum pump connected to the outlet 206 (particularly to remove air and moisture), (3) backfill the chamber 201 with a gas or a gas mixture using suitable means known in the art (for example, filling the chamber 201 with inert gases via the inlet 205), (4) position one of the enclosure components relative to another enclosure components (e.g., place the lid 203 on top of the container 204) and apply pressure to at least one of the enclosure components (e.g., to the lid 203 via the push rod 202) in order to seal the interior chamber 209 and/or device 210 from the rest of the chamber 201 (e.g., by deforming a crushable material, placing a sharp edged ridge of one of the enclosure components into another of the enclosure components, and/or any variation of any of the embodiment set forth herein), (5) evacuate the chamber 201 using suitable means known in the art, for example, a vacuum pump connected to the outlet 206, (6) measure/verify the leak rate using any suitable means and/or methods known in the art (e.g., a leak detector 211 connected to the outlet 206). If the measured leak rate is satisfactory, ignite the foil and/or reactive multilayer 208 and thus permanently seal the enclosure. If the measured leak rate is unsatisfactory, address the one or more deficiencies and repeat one or more steps of the process. One advantage of the invention is that it eliminates or minimizes the loss of sensitive components during the sealing process.

One of ordinary skill in the art realizes that any of the aforementioned aspects of any of the embodiments may be combined with any of the aspects of any of the other embodiments. Moreover, one of ordinary skill in the art realizes that any of the aforementioned aspects may be removed from any of the embodiments without departing from the true scope of the invention. In addition, one of ordinary skill in the art realizes that the embodiments disclosed in any of the references incorporated herein by reference are exemplary only, and despite what may be written in the disclosures, do not limit the invention in any way.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A sealed product, comprising:
at least two components defining a container including a sealed interior cavity;
a crushable material disposed between the at least two components, the crushable material being in a deformed state and forming a seal between the at least two components; and
a fusible material and a remnant of a chemical transformation of a reactive multilayer material disposed between the at least two components and joining said at least two components.

2. The sealed product of claim 1, wherein the reactive multilayer material includes a reactive multilayer foil.

3. The sealed product of claim 1, wherein the crushable material and the remnant of the chemical transformation cooperate to form a hermetic seal between the at least two components.

4. The sealed product of claim 1, wherein the crushable material is configured to permanently deform.

5. The sealed product of claim 1, wherein the crushable material is configured to reversibly deform.

6. The sealed product of claim 1, wherein the crushable material includes a soft metal.

7. The sealed product of claim 6, wherein the soft metal includes at least one of copper, gold, aluminum, stainless steel, Kovar, and soft solder.

8. The sealed product of claim 1, wherein the crushable material includes a compressible polymer.

9. The sealed product of claim 8, wherein the compressible polymer includes at least one of buna rubber, silicon rubber, and viton.

10. The sealed product of claim 1, wherein the crushable material is at least partially disposed in a groove of one of the at least two components.

11. The sealed product of claim 10, wherein the crushable material is at least partially disposed in another groove of another of the at least two components.

12. The sealed product of claim 1, wherein the crushable material is disposed against a protrusion on one of the at least two components.

13. The sealed product of claim 1, wherein the crushable material is disposed against another protrusion on another of the at least two components.

14. The sealed product of claim 1, wherein the crushable material is disposed in a corner of one of the at least two components.

15. The sealed product of claim 1, wherein one of the at least two components is a lid and another of the at least two components is a container body.

16. The sealed product of claim 1, wherein the crushable material substantially prevents the fusible material from flowing into the sealed interior cavity.

17. The sealed product of claim 1, wherein the crushable material is disposed between the fusible material and the sealed interior cavity.

18. The sealed product of claim 1, wherein the crushable material is disposed between the remnant of the chemical transformation of the reactive multilayer material and the sealed interior cavity.

19. The sealed product of claim 1, wherein the crushable material is arranged relative to the fusible material and the sealed interior cavity so as to substantially prevent the fusible material from flowing into the sealed interior cavity.

* * * * *